(12) United States Patent
Gluschenkov et al.

(10) Patent No.: US 8,288,222 B2
(45) Date of Patent: Oct. 16, 2012

(54) APPLICATION OF CLUSTER BEAM IMPLANTATION FOR FABRICATING THRESHOLD VOLTAGE ADJUSTED FETS

(75) Inventors: Oleg Gluschenkov, Hopewell Junction, NY (US); Dae-Gyu Park, Hopewell Junction, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 12/582,139

(22) Filed: Oct. 20, 2009

(65) Prior Publication Data

US 2011/0089495 A1 Apr. 21, 2011

(51) Int. Cl.
*H01L 21/8238* (2006.01)
(52) U.S. Cl. . 438/217; 257/315; 257/369; 257/E21.209; 257/E21.336; 257/E21.409
(58) Field of Classification Search .................. 257/315, 257/369
See application file for complete search history.

(56) References Cited

U.S. PATENT DOCUMENTS

| | | | |
|---|---|---|---|
| 6,071,791 A | 6/2000 | Hughes et al. | |
| 6,524,918 B2 | 2/2003 | Park et al. | |
| 7,023,055 B2 | 4/2006 | Ieong et al. | |
| 7,329,923 B2 | 2/2008 | Doris et al. | |
| 2005/0116290 A1 | 6/2005 | de Souza et al. | |
| 2006/0043497 A1 | 3/2006 | Kimizuka et al. | |
| 2006/0286802 A1 | 12/2006 | Yu et al. | |
| 2007/0023842 A1* | 2/2007 | Jung et al. | 257/369 |
| 2007/0059874 A1* | 3/2007 | Moumen et al. | 438/199 |
| 2007/0148838 A1* | 6/2007 | Doris et al. | 438/197 |
| 2007/0278587 A1 | 12/2007 | Aoyama et al. | |
| 2008/0145992 A1* | 6/2008 | Jain | 438/305 |
| 2011/0031554 A1* | 2/2011 | Fang et al. | 257/369 |
| 2011/0081754 A1* | 4/2011 | Jagannathan et al. | 438/217 |

* cited by examiner

*Primary Examiner* — A. Sefer
(74) *Attorney, Agent, or Firm* — Scully, Scott, Murphy & Presser, P.C.; Joseph P. Abate, Esq.

(57) ABSTRACT

Semiconductor structures including a high k gate dielectric material that has at least one surface threshold voltage adjusting region located within 3 nm or less from an upper surface of the high k gate dielectric are provided. The at least one surface threshold voltage adjusting region is formed by a cluster beam implant step in which at least one threshold voltage adjusting impurity is formed directly within the high k gate dielectric or driven in from an overlying threshold voltage adjusting material which is subsequently removed from the structure following the cluster beam implant step.

18 Claims, 6 Drawing Sheets

APPLICATION OF CLUSTER BEAM IMPLANTATION FOR FABRICATING THRESHOLD VOLTAGE ADJUSTED FETS

BACKGROUND

The present invention relates to a semiconductor structure and a method of fabricating the same. More particularly, the present invention relates to a field effect transistor (FET) including a threshold voltage adjusted gate stack and a method of fabricating the same.

In semiconductor devices including field effect transistors (FETs), threshold voltage of the transistors has been conventionally controlled by doping an impurity into the channel region and by appropriately adjusting the dose amount. Threshold voltage control using only this technique, e.g., only through adjustment of the amount of the channel impurity, however, raises nonconformities such that an increase in the dose of the impurity to be doped into the channel region may lower ON-state current due to scattering by the impurity, may increase the Gate-Induced Drain Leakage (GIDL) current, and may increase substrate current upon application of substrate voltage. For this reason, low-power-consumption devices having a large amount of impurity doped into the channel region have occasionally resulted in a decrease in an ON-state current, and an increase in the GIDL current.

Another prior art technique that has been conventionally used to control the threshold voltage of FET devices is to fabricate a device in which different transistors, e.g., nFETs and pFETs, are formed on gate oxides that have a different thickness. That is, it is known to form a device in which the thickness of a gate oxide film of an nFET or pFET is different from that of a gate oxide film of another nFET or pFET.

In recent years, there has been another trend of using a high dielectric constant dielectric film, i.e., a high k dielectric, as the gate insulating film of FET devices. High k dielectrics are those dielectrics that have a dielectric constant that is greater than silicon oxide. Representative high k dielectrics that are useful as a gate insulating material include metal oxides such as, for example, zirconium oxide and hafnium oxide. The use of high k dielectrics as the gate insulating film of a metal oxide semiconductor field effect transistor (MOSFET) can successfully reduce the equivalent silicon oxide thickness in an electrical sense, even if the physical thickness thereof is increased relative to a silicon oxide gate dielectric. Hence, high k dielectric films when used as a gate insulating film are stable both in a physical sense and in a structural sense. This makes it possible to increase the MOS capacity for improved MOSFET characteristics, and to reduce gate leakage current as compared with the conventional devices in which silicon oxide was used as the gate insulating film.

Although high k dielectrics provide improvements over conventionally used silicon oxide as the gate insulating film in a FET device, the use of the same is not without problems. For example, FET devices including high k gate dielectrics exhibit a non-ideal threshold voltage when the device is used. Although this problem, e.g., threshold voltage shift from an ideal value, is exhibited for both pMOSFET and nMOSFET devices, it is more pronounced with nMOSFET devices.

In the prior art, various techniques including, for example, forming a threshold voltage adjusting layer interposed between the high k gate dielectric and the gate electrode have been proposed. Although such threshold voltage adjusting techniques have been proposed, threshold voltage centering still remains a challenge in such devices due to the difficulty of integrating band-edge metals for nFETs and pFETs.

Also, in prior art techniques in which a threshold voltage adjusted gate stack is provided that includes a threshold voltage adjusting layer interposed between a high k gate dielectric and a gate electrode, wet or dry etching is typically used in patterning the threshold voltage adjusted gate stacks. When wet etching is employed in patterning the threshold voltage adjusted gate stacks, an undercut of the threshold voltage adjusting layer beneath the gate electrode is observed. The undercutting of the threshold voltage adjusting layer is undesirable since it prohibits geometrically compact integration of adjacent FETs with different threshold voltage characteristics (e.g., adjacent pFETs and nFETs). The presence of such an undercut may also provide a diffusion path for unwanted atomic and molecular species (e.g., oxygen) that may ingress into the high k gate dielectric at later fabrication steps and interfere with its structure causing threshold voltage shifts.

When dry reactive ion etching is employed in patterning the threshold voltage adjusted gate stacks, its energetic reactive ions create damage in the underlying high k layer leading to an increased gate leakage and/or threshold voltage shift.

Also, in prior art techniques, a thermal sintering step is often required in order to provide a proper distribution of atoms in the threshold voltage adjusting layer and the high k gate dielectric which causes their chemical inter-bonding. Such a sintering step may require a relatively high thermal budget that undesirably affects other important properties of structural elements such as compromising thermal stability and integrity of the gate electrode, instigating undesirable diffusion of dopants, and/or creating undesirable modification in silicides that may be present in the substrate during such sintering step.

As such, there exists a need for providing a plurality of MOSFET devices including those with a high k gate dielectric and a conductive electrode in which ideal threshold voltages are maintained during operation independent of device geometry, type, and proximity. In addition, there exists a need for providing a method for fabricating such semiconductor devices and integrated circuits.

SUMMARY

In one embodiment of the present invention, a semiconductor structure is provided that includes a high k gate dielectric located atop a semiconductor substrate. In the structure, the high k gate dielectric includes at least one surface threshold voltage adjusting region located within 3 nm or less, preferably from 0 nm to 2 nm, from an upper surface of the high k gate dielectric. The semiconductor structure also includes at least one conductive layer atop the high k gate dielectric. The semiconductor structure can be used for tuning the threshold voltage of a pFET device, an nFET device or both a pFET device and an nFET device, and adjacent pFET and/or nFET devices.

Depending on the type of device being fabricated, the at least one surface threshold voltage adjusting region within the high k gate dielectric includes one of a pFET threshold voltage adjusting impurity and an nFET threshold voltage adjusting impurity. Examples of nFET threshold voltage adjusting impurities include a rare earth metal impurity selected from Group IIIB of the Periodic Table of Elements or an alkaline earth metal impurity selected Group IIA of the Periodic Table of Elements. Examples of pFET threshold voltage adjusting impurities include Al, Ge, Ti and Ta.

When a CMOS device is to be fabricated, a semiconductor structure is provided that includes a high k gate dielectric located atop a semiconductor substrate including a first device region and a second device region. The high k gate dielectric in one of the device regions includes at least a first surface threshold voltage adjusting region located within 3 nm or less, preferably from 0 nm to 2 nm, from an upper surface of the high k gate dielectric, while the high k gate dielectric in the other device region includes a second surface threshold voltage adjusting region located within 3 nm or less, preferably from 0 nm to 2 nm, from an upper surface of the high k gate dielectric located. The first and second surface threshold voltage adjusting regions may include different types of threshold voltage adjusting impurities that are selected to tune the threshold voltage of the device being fabricated in that region.

In addition to providing semiconductor structures, a method of fabricating such a structure is also provided. The method generally includes forming a high k gate dielectric atop a semiconductor substrate; and forming at least one surface threshold voltage adjusting region in the high k gate dielectric located within 3 nm or less, preferably from 0 nm to 2 nm, from an upper surface of the high k gate dielectric.

The at least one surface threshold voltage adjusting region is formed utilizing a cluster beam implant that introduces impurities via a fusion-type process in a non-ballistic implantation regime. In one embodiment, the cluster beam implant includes directly implanting or fusing a threshold voltage adjusting impurity within the upper surface of the high k gate dielectric. In this embodiment, a thin conductive layer can, in some instances, be present on the high k gate dielectric prior to performing the cluster beam fusion-type implant.

In another embodiment of the inventive method, a threshold voltage adjusting material is formed atop the high k gate dielectric prior to performing the cluster beam fusion-type implant. When the threshold voltage adjusting material is present, an inert ion cluster beam implant is performed which drives and fuses a threshold voltage adjusting impurity from the threshold voltage adjusting material into the upper surface of the high k gate dielectric.

The method disclosed herein can be used for tuning the threshold voltage of a pFET device, an nFET device or both a pFET device and an nFET device, and adjacent pFET and/or nFET devices.

When both a pFET device and an nFET device are formed, the method includes forming a high k gate dielectric atop a semiconductor substrate including a first device region and a second device region; selectively forming a first surface threshold voltage adjusting region in one portion of the high k gate dielectric located within 3 nm or less, preferably from 0 nm to 2 nm, from an upper surface of the high k gate dielectric in either the first device region or the second device region; and selectively forming a second surface threshold voltage adjusting region in another portion of the high k gate dielectric located within 3 nm or less, preferably from 0 nm to 2 nm, from the upper surface of the high k gate dielectric in the other of the first device region or the second device region not including the first surface threshold voltage adjusting region.

DETAILED DESCRIPTION

The present invention, which provides a semiconductor structure including a high k gate dielectric having a threshold voltage adjusting impurity within a surface region thereof, and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
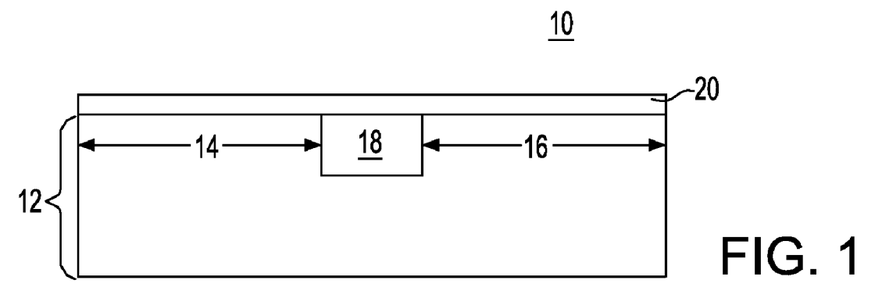
FIG. 1 is a pictorial representation (through a cross sectional view) illustrating an initial structure including a high k gate dielectric located atop a semiconductor substrate including at least a first device region and a second device region that can be used in the present invention.

Reference is first made to FIG. 1 which is an initial structure 10 that can be employed in the various embodiments of the present invention. Specifically, initial structure 10 includes a semiconductor substrate 12 including a first device region 14 and a second device region 16 that are isolated from each other by an isolation region 18. Although two devices regions are described and illustrated, the present invention can be employed in embodiments wherein a single device region is present, or in embodiments in which a plurality of device regions are present. The initial structure 10 illustrated in FIG. 1 also includes a high k gate dielectric 20 located atop the semiconductor substrate 12 in both the first device region 14 and the second device region 16.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region 18 is typically formed into the semiconductor substrate 12. The at least one isolation region 18 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs.

The substrate 12 including the at least one isolation region 18 now includes a first device region 14 and a second device region 16. The first device region 14 is either an nFET device region or a pFET device region, while the second device region 16 is the other of an nFET device region or a pFET device region. In order to better illustrate the present invention and in this embodiment of the invention, the first device region 14 is an nFET device region, while the second device region 16 is a pFET device region. In some embodiments of the invention, a single device region can be present instead of the two device regions mentioned herein above.

After processing the semiconductor substrate 12, a chemox layer (not shown) is optionally formed on the surface of the semiconductor substrate 12. The optional chemox layer is formed utilizing a conventional growing technique that is well known to those skilled in the art including, for example, oxidation or oxynitridation. In some embodiments of the invention, the chemox layer is formed by a wet chemical oxidation process. When the substrate 12 is a Si-containing semiconductor, the chemox layer is comprised of silicon oxide, silicon oxynitride or a nitrided silicon oxide. When the substrate 12 is other than a Si-containing semiconductor, the chemox layer may comprise a semiconducting oxide, a semiconducting oxynitride or a nitrided semiconducting oxide. The thickness of the chemox layer is typically from 0.5 to 1.2 nm, with a thickness from 0.8 to 1 nm being more typical. The thickness, however, may be different after processing at higher temperatures, which are usually required during FET or CMOS fabrication.

A high k gate dielectric 20 is then formed atop the semiconductor substrate 12. In some embodiments, and as illustrated, the high k gate dielectric 20 is formed directly on a surface of the semiconductor substrate 12. In other embodiments of the invention, the high gate dielectric 20 is formed on a surface of the chemox layer described above.

The high k gate dielectric 20 employed in the present invention includes any dielectric metal oxide having a dielectric constant that is greater than the dielectric constant of silicon oxide, e.g., 3.9. Typically, the high k gate dielectric 20 that is employed has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, a silicate thereof, and an alloy thereof. Multilayered stacks of these high k materials can also be employed as the high k gate dielectric 20. Each value of x is independently from 0.5 to 3 and each value of y is independently from 0 to 2.

The thickness of the high k gate dielectric 20 may vary depending on the technique used to form the same. Typically, however, the high k gate dielectric 20 has a thickness from 0.5 nm to 10 nm, with a thickness from 1.0 nm to 5 nm being even more typical. The high k gate dielectric 20 employed may have an effective oxide thickness on the order of, or less than, 1 nm.

The high k gate dielectric 20 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 2:
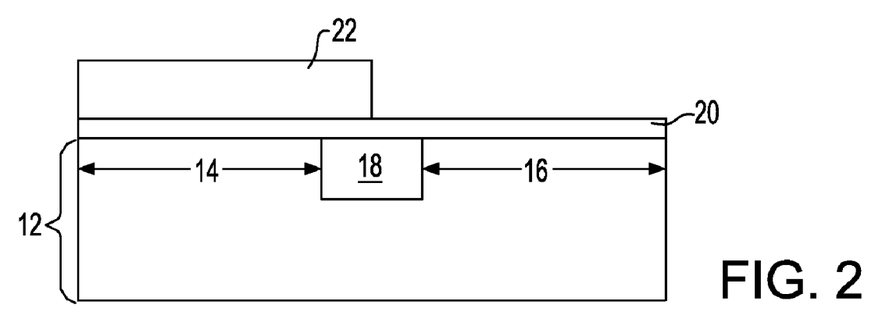
FIG. 2 is a pictorial representation (through a cross sectional view) illustrating the structure of FIG. 1 after forming a first patterned mask atop the high k gate dielectric in one device region of the semiconductor substrate in accordance with a first embodiment of the invention.

Referring to FIG. 2, a first patterned mask 22 is formed on the surface of the high k gate dielectric 20 protecting one of the device regions, while leaving the other device region unprotected. In the embodiment illustrated, the first patterned mask 22 is protecting the high k gate dielectric 20 that is located in the first device region 14, while the high k gate dielectric 20 in the second device region 16 is left unprotected.

The patterned mask 22 employed may include a hard mask, a photoresist or a multi-layered stack thereof. In one embodiment, the patterned mask 22 is a photoresist. In another embodiment, the patterned mask 22 is a hard mask selected from a semiconductor oxide, semiconductor nitride, or semiconductor oxynitride.

The patterned mask 22 is formed utilizing conventional techniques including deposition, photolithography and optionally etching, that are well known to those skilled in the art. In particular, and when the patterned mask is comprised solely of a photoresist, a blanket layer of photoresist material is first applied to the upper surface of the high k gate dielectric 20 utilizing a conventional deposition process such as, for example, spin-on coating, evaporation, chemical vapor deposition (CVD), and plasma enhanced chemical vapor deposition (PECVD). After deposition of the blanket layer of photoresist, the blanket layer is patterned by lithography including exposing the photoresist to a desired pattern of radiation and then developing the exposed resist utilizing a conventional resist developer.

When a hard mask is used as the patterned mask 22, a blanket layer of hard mask material is first deposited on the surface of the high k gate dielectric 20 utilizing a conventional deposition process including, for example, CVD, PECVD, chemical solution deposition, evaporation, atomic layer deposition (ALD), and physical vapor deposition (PVD). Next, a blanket layer of photoresist is applied atop the blanket layer of hard mask material, and thereafter lithography is used to pattern the photoresist. The pattern within the patterned resist is transferred to the underlying hard mask material utilizing one of dry etching (reactive ion etching, ion beam etching, plasma etching, or laser ablation) and chemical wet etching. The patterned resist is optionally removed from the structure following the pattern transfer step utilizing a conventional resist stripping process well known to those skilled in the art. Alternatively, the patterned resist can remain atop the pattern hard mask and form a multilayered patterned mask.

After forming the first patterned mask 22 atop one of the device regions of the substrate 12, the structure illustrated in FIG. 2 is subjected to a cluster beam implant step 24 in which a first threshold voltage adjusting impurity is introduced into an upper surface of the exposed high k gate dielectric 20 not including the first patterned mask 22. The term "threshold voltage adjusting impurity" as used throughout the instant application denotes a dopant that moves the threshold voltage of a gate stack towards either the nFET or pFET band edge.

The upper surface of the exposed high k gate dielectric 20 including the first threshold voltage adjusting impurity is referred to herein as a first surface threshold voltage adjusting region and is labeled as region 26 in the drawings. See, for example, FIG. 3 which includes the resultant structure during the cluster beam implant. The first surface threshold voltage adjusting region 26 of the high k gate dielectric 20 is located at or near the upper surface of the high k gate dielectric. That is, the first surface threshold voltage adjusting region 26 of the high k gate dielectric 20 is located within 3 nm or less from the upper surface of the high k gate dielectric 20. More preferably, the first surface threshold voltage region 26 is located within a range from 0 nm to 3 nm from the upper surface of the high k gate dielectric 20. It is noted that at 0 nm, the surface threshold voltage region would be located at the upper surface of the high k gate dielectric 20.

Figure 3:
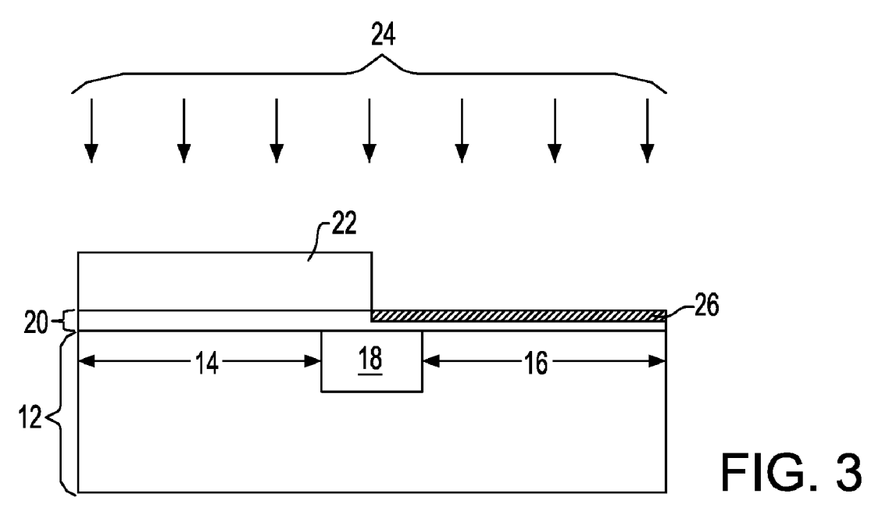
FIG. 3 is a pictorial representation (through a cross sectional view) illustrating the structure of FIG. 2 during a step of selectively providing a first threshold voltage adjusting impurity into an upper surface of the exposed high k gate dielectric not including the first patterned mask.

The first threshold voltage adjusting impurity that is employed may be an nFET threshold voltage adjusting impurity or a pFET threshold voltage adjusting impurity depending on the type of device being fabricated within the exposed region. In the embodiment illustrated, for example, the first threshold voltage adjusting impurity would be an nFET threshold voltage adjusting impurity.

One example of an nFET threshold voltage adjusting impurity that can be used in the present invention is a rare earth metal impurity selected from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal impurity comprises La, Ce, Y, Sm, Er and/or Tb, with La being more preferred.

Another example of an nFET threshold voltage adjusting impurity that can be used in the present invention is an alkaline earth metal impurity selected Group IIA of the Periodic Table of Elements including, for example, Be, Mg, Ca, Sr, Ba and mixtures thereof. In one preferred embodiment of the present invention, the alkaline earth metal impurity is Mg.

In addition to nFET threshold voltage adjusting impurities, the first threshold voltage adjusting impurity can alternatively be a pFET threshold voltage adjusting impurity. Examples of pFET threshold voltage adjusting impurities include Al, Ge, Ti and Ta. In one preferred embodiment, the pFET threshold voltage adjusting impurity is Al.

Notwithstanding the type of first threshold voltage adjusting impurity employed, the first threshold voltage adjusting impurity is implanted by a cluster beam implantation process. The term "cluster beam implantation" as used throughout the present application denotes an implantation process in which an impurity is fused into the high k gate dielectric by a non-ballistic implantation process. In such a process, implanting particles (clusters) produce local heating and melting of the high k gate dielectric causing materials of the high k gate dielectric and the clusters to intermix and to bond to each other. The depth of such a "molten" zone is controlled by the energy of ionized clusters and is less than 3 nm. The duration of such local heating and melting is very short, on the scale of tens of picoseconds, resulting in full compatibility with temperature-sensitive elements that can be present in the structure at this step (e.g., the photoresist mask 22). In contrast, a typical ion implantation technique implants ions and ionized molecules with energies per implanted ion/atom of typically 100-3000 eV far exceeding the bonding energy of many high k materials (typically, 2-5 eV) leading to a ballistic implantation regime. In this regime, implanted ions/atoms do not cause appreciable local heating, but rupture numerous bonds of the high k material along its path. Consequently, there is no intermixing with the high k material: implanted ions/atoms are inserted into the high k material leaving a wake of defects in its path. A proper sintering step is then required to bond the implanted impurity into a proper bonding state needed for affecting threshold voltage, to heal out the defects, and, if needed, to inter-diffuse the material.

The cluster beam implantation process is performed under conditions that are capable of forming the first surface threshold voltage adjusting region 26 within 3 nm or less, preferably from 0 nm to 2 nm, from the upper surface of the high k gate dielectric 20. Specifically, the cluster size is typically from 300 atoms to 40,000 atoms, with a cluster size from 3000 to 20,000 being more typical. Clusters are formed from a neutral carrier gas and a gaseous precursor of threshold voltage adjusting atoms. The ratio of neutral atoms to threshold voltage adjusting atoms within the cluster can vary from 0.01% to 10%. The neutral atoms are typically large inert atoms such as Ar or Xe. Other carrier gases such as $N_2$ can also be used, but they introduce active elements (such as nitrogen) into the first surface threshold voltage adjusting region 26. As was eluded above, the threshold voltage adjusting atoms are typically metallic elements that can be introduced into the stream of a carrier gas in the gaseous form. Metal fluorides as well as metal organic precursor can also be used. Alternatively, high vapor pressure metals can be evaporated into a gaseous stream of the carrier gas that quickly undergoes clusterization through adiabatic expansion into a higher vacuum chamber. Formed clusters that contain useful metallic impurities are then ionized and accelerated towards the high k material in a high vacuum chamber. Typical cluster energy is from 0.5 keV to 80 keV. However, the typical energy per atom in the cluster is less than 10 eV prohibiting any ballistic-type implantation process. The ionized cluster beam raster scans the substrate. The intermixing zone is the function of cluster energy and nearly independent of cluster size. If the target thickness of the first surface threshold voltage adjusting region 26 is 2 nm, the energy of singly ionized cluster is from 0.5 keV to 5 keV. The typical cluster dose is typically from 1e15 clusters/$cm^2$ to about 1e18 clusters/$cm^2$. In some embodiments, having a relatively large cluster dose is important in order to insure areal uniformity of threshold voltage adjusting atoms in the resultant surface threshold voltage adjusting region 26. For instance, in order to insure that the dose variation of threshold voltage adjusting atoms within 100 $nm^2$ area is below 1%, one needs to provide the cluster dose in access of 1e16 clusters/$cm^2$. The cluster dose and the dose of threshold voltage adjusting atoms can be set independently by adjusting the ratio of neutral atoms and threshold adjusting atoms in the cluster. It is noted that the intermixing or molten zone boundary is very sharp with an implant tail decaying on the order of 4 decade/nm or more.

Figure 4:
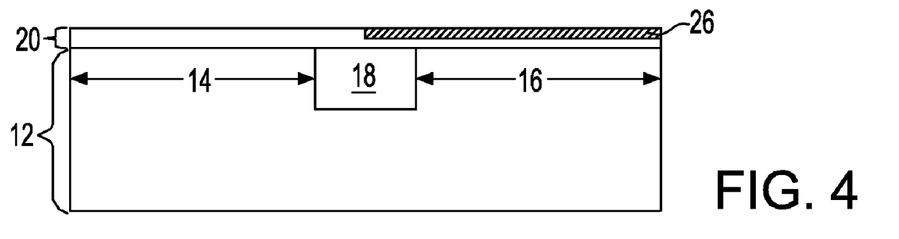
FIG. 4 is a pictorial representation (through a cross sectional view) illustrating the structure of FIG. 3 after removing the first patterned mask therefrom.

Referring now to FIG. 4, the first patterned mask 22 is removed from the structure utilizing a conventional stripping process well known to those skilled in the art. When the patterned mask 22 is comprised of a resist material, the resist material can be removed utilizing a conventional ashing process that does not interfere with high k gate dielectric 20 or the first surface threshold voltage adjusting region 26. Specifically, a reducing chemistry such as $H_2$-, $H_2/N_2$-, or $H_2/O_2$- based plasma ashing is preferred. When the patterned mask 22 is comprised of a hard mask material, the hard mask material can be removed utilizing a conventional reactive ion etching (RIE), chemical dry etching (CDE) processes, or a wet etching process. Preferably, these etching processes should exhibit a substantial etch selectivity with respect to high k gate dielectric 20 and the first surface threshold voltage adjusting region 26.

Figure 5:
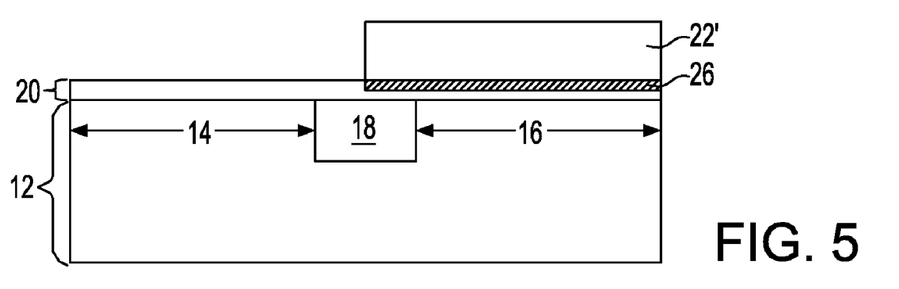
FIG. 5 is a pictorial representation (through a cross sectional view) illustrating the structure of FIG. 4 after forming a second patterned mask on the device region including the high k gate dielectric having a first threshold voltage adjusting impurity within an upper surface thereof
Figure 6:
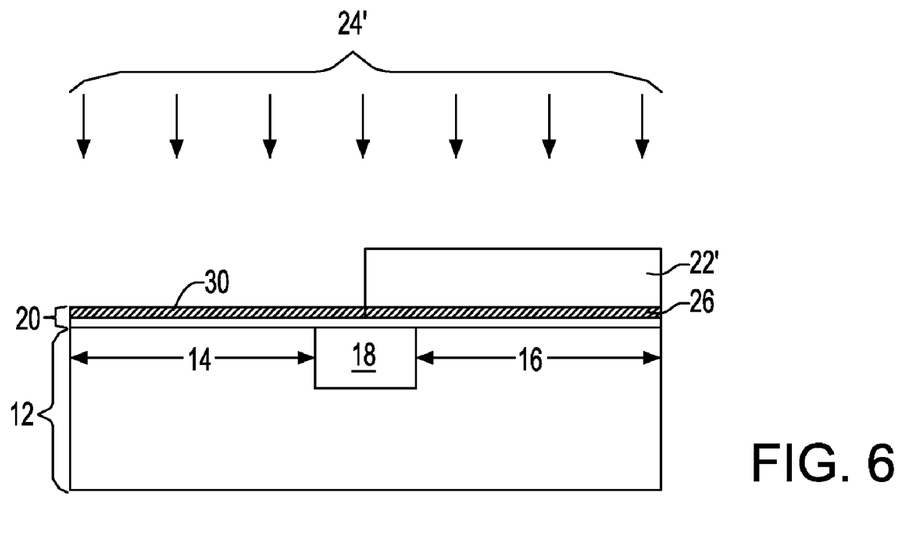
FIG. 6 is a pictorial representation (through a cross sectional view) illustrating the structure of FIG. 5 during a step of selectively providing a second threshold voltage adjusting impurity into an upper surface of the exposed high k gate dielectric in the device region of the substrate not including the first threshold voltage adjusting impurity.
Figure 7:
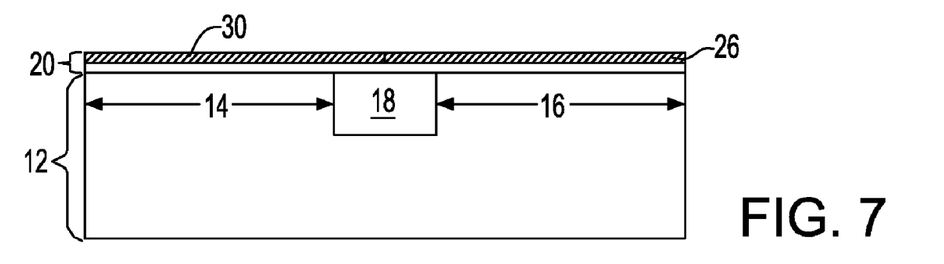
FIG. 7 is a pictorial representation (through a cross sectional view) illustrating the structure of FIG. 6 after removing the second patterned mask therefrom.

If the substrate includes a single device region, the processing steps shown in FIGS. 5-7 are omitted.

Referring now to FIG. 5, a second patterned mask 22' is formed in the device region including the high k gate dielectric 20 having the first surface threshold voltage adjusting region 26. As such, the second patterned mask 22' protects the device region including the first surface threshold voltage adjusting region 26 within the high k gate dielectric 20, while leaving the other device region exposed. The second patterned mask 22' is comprised of at least one of the materials mentioned above for the first patterned mask 22. Also, the second patterned mask 22' is formed utilizing the same processing steps as mentioned above in regard to the fabrication of the first patterned mask 22.

After forming the second patterned mask 22' atop the device region including the first surface threshold voltage adjusting region 26, the structure illustrated in FIG. 5 is subjected to a second cluster beam implant step 24' in which a second threshold voltage adjusting impurity is introduced into an upper surface of the exposed high k gate dielectric 20 not including the second patterned mask 22'. See FIG. 6 in which the second surface threshold voltage adjusting region is labeled as 30.

The second threshold voltage adjusting impurity employed is the other of a pFET or an FET threshold voltage adjusting impurity which is not used as the first threshold voltage adjusting impurity. That is, when the first threshold adjusting impurity is a pFET threshold voltage adjusting impurity, then the second threshold voltage adjusting material is an nFET threshold voltage adjusting impurity. Likewise, when the first threshold voltage adjusting impurity is an nFET threshold voltage adjusting impurity, then the second threshold voltage adjusting material is a pFET threshold voltage adjusting impurity.

Alternatively, the second threshold voltage adjusting impurity employed is a different threshold voltage adjusting impurity (different type, dose, or fusion depth) used for a different device of the same polarity. In this manner, two types of nFETs can be beneficially produced on the same substrate with two different threshold voltages. Likewise, two types of pFETs can be beneficially produced on the same substrate with two different threshold voltages.

For the particular embodiment illustrated in the drawings, the second surface threshold voltage adjusting region 30 is composed of an nFET threshold voltage adjusting impurity, while the first surface threshold voltage adjusting region 26 is composed of a pFET threshold voltage adjusting impurity.

The second threshold voltage adjusting impurity is formed utilizing the above described cluster beam implantation process. The upper surface of the exposed high k gate dielectric 20 including the second threshold voltage adjusting impurity is referred to herein as a second surface threshold voltage adjusting region and is labeled as region 30 in the drawings. Like the first surface threshold voltage adjusting region 26, the second surface threshold voltage adjusting region 30 of the high k gate dielectric 20 is located at or near the upper surface of the high k gate dielectric. That is, the second surface threshold voltage adjusting region 30 of the high k gate dielectric 20 is located within 3 nm or less, preferably from 0 nm to 2 nm, from the upper surface of the high k gate dielectric 20.

Referring now to FIG. 7, the second patterned mask 22' is stripped from the structure utilizing one of the stripping processes mentioned above in regard to the stripping of the first patterned mask 22.

The patterned mask 22 or 22' can be reapplied and stripped as described above more than twice and the process of threshold voltage modification can also be repeated more than twice producing a plurality of devices with different threshold voltages and different polarities (not shown). Furthermore, these devices can be in direct proximity to each other since the resolution of forming threshold voltage adjusting impurity regions via the process disclosed herein is limited by the resolution and overlay tolerances of photolithography processes for mask patterning layers.

Figure 8:
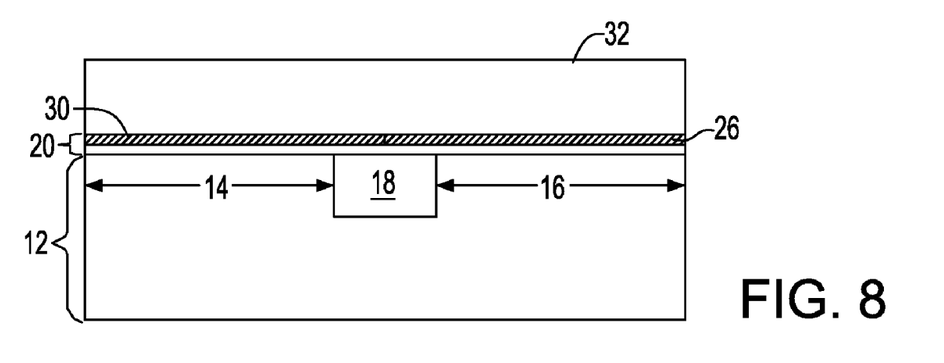
FIG. 8 is a pictorial representation (through a cross sectional view) illustrating the structure of FIG. 7 after forming at least one conductive material on the surface of the high k gate dielectric including the threshold voltage adjusting impurities.

After stripping the second patterned mask 22' from the structure, at least one conductive material 32 is formed on the surface of the high k gate dielectric 20 including the surface threshold voltage adjusting regions 26 and 30. The resultant structure that is formed is illustrated in FIG. 8. The at least one conductive layer 32 that is employed in the present invention includes any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., titanium nitride, tantalum nitride, and tungsten nitride), an elemental metal carbide (e.g., titanium carbide, tantalum carbide, and tungsten carbide) an elemental metal silicide (e.g., tungsten silicide, nickel silicide, and titanium silicide) and multilayers thereof. Preferably, the at least one conductive layer 32 includes at least an elemental metal. In one embodiment of the present invention, a single conductive layer is formed. In another embodiment of the present invention, a first conductive layer and a second conductive layer are formed.

The at least one conductive layer 32 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the at least one conductive layer 32, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited at least one conductive layer 32 typically has a thickness from 2 nm to 15 nm, with a thickness from 5 nm to 10 nm being even more typical.

Figure 9:
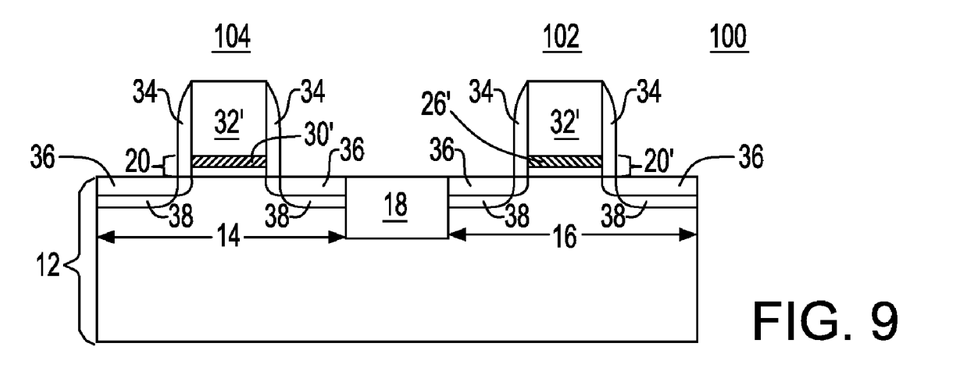
FIG. 9 is a pictorial representation (through a cross sectional view) illustrating the structure of FIG. 8 after completing the fabrication of the CMOS devices.

After forming the at least one conductive layer 32, further CMOS processing steps are employed in fabricating at least one FET device. The further CMOS processing steps include, but are not limited to, patterning of the material stack shown in FIG. 8 utilizing conventional lithography and etching, optional gate sidewall passivation, optional spacer formation, source and drain extension formation and source and drain region formation. In FIG. 9, there is shown a pFET device 100 including a patterned pFET gate stack 102 and a patterned nFET gate stack 104 that are formed after the further CMOS processing steps. The patterned pFET gate stack 102 includes, from bottom to top, patterned high k gate dielectric 20', patterned first surface threshold voltage adjusting region 26', and patterned conductive layer 32', while the patterned nFET gate stack 104 includes, from bottom to top, patterned high k gate dielectric 20', patterned second surface threshold voltage adjusting region 30', and patterned conductive layer 32'. Also shown in the drawings, is dielectric spacer 34, source/drain extension regions 36 and source/drain regions 38. It is emphasized that regions 26' and 30' are located within the high k gate dielectric.

Reference is now made to FIGS. 10A-10D which illustrates an alternative to the first embodiment of the invention depicted in FIGS. 1-9 in which a first conductive layer is formed prior to introducing the threshold voltage adjusting impurities into the high k gate dielectric. In particular, after forming the initial structure 10 shown in FIG. 1, a first conductive layer 50 is formed atop the high k gate dielectric 20; see for example FIG. 10A. The first conductive layer 50 is an ultra thin layer having a thickness from 0.1 nm to 10 nm, with a thickness from 0.1 nm to 5 nm being more preferred. It can also be specified in terms of surface density of its elemental atoms rather than its physical thickness. Accordingly, the density of its elemental atoms is from 1e15 atoms/cm$^2$ to 1e18 atoms/cm$^2$, with 1e15 atoms/cm$^2$ to 5e16 atoms/cm$^2$ being more preferred. The first conductive layer 50 includes one of the conductive materials described above for that least one conductive layer 32, and the first conductive layer 50 is formed utilizing one of the techniques described above for the at least one conductive layer 32. Preferably, the layer 50 contains one of the base elements that could be included into the high k gate dielectric layer 20 as described above. These elements include Zr, Hf, Ti, Ta, Sr, Y, La, Al, and Si.

Figure 10A:
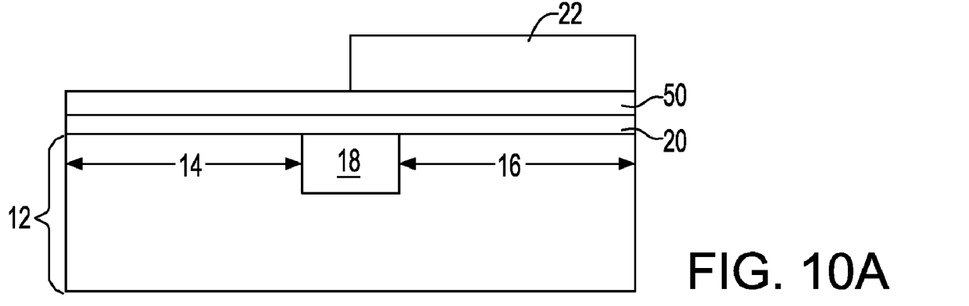
FIGS. 10A-10D are pictorial representations (through cross sectional views) illustrating an alternative to the first embodiment of the invention in which a first conductive layer is formed prior to introducing the threshold voltage adjusting impurities into the high k gate dielectric.
Figure 10B:
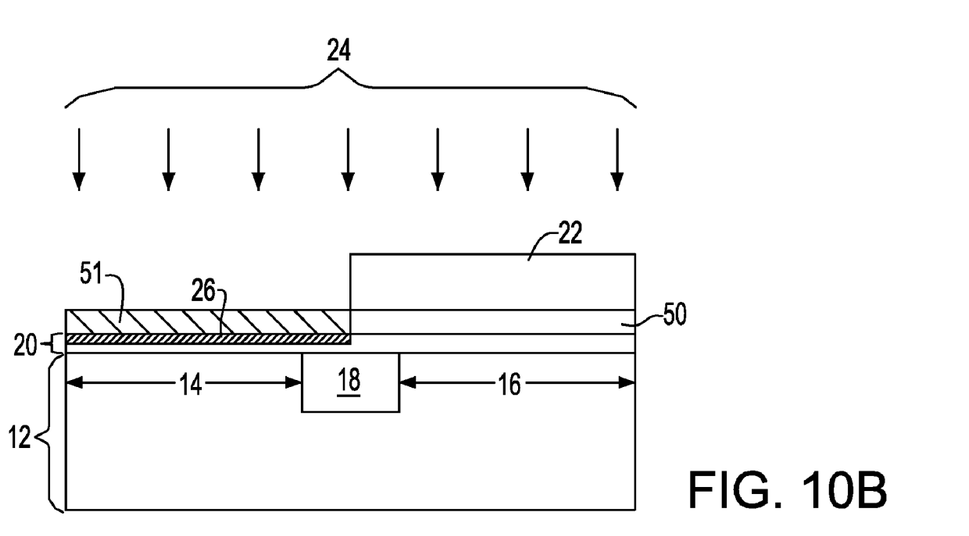

After forming the first conductive layer 50, a first patterned mask 22 is formed on the surface of the first conductive layer 50 in one of the device regions. In the embodiment illustrated in FIG. 10A, the first patterned mask 22 is formed over the second device region 16. Referring to FIG. 10B, a first threshold voltage adjusting impurity is implanted into the upper region of the high k gate dielectric 20 and exposed layer 50 in the first device region 14. The first threshold voltage adjusting impurity is either a pFET threshold voltage adjusting impurity or an nFET threshold voltage adjusting impurity. The type of threshold voltage adjusting impurity formed into the high k gate dielectric 20 in the first device region 14 depends on the type of device being formed. Again nFET threshold voltage adjusting impurities are formed in device regions in which nFET devices will be subsequently formed, and pFET threshold voltage adjusting impurities are formed in device regions in which pFET devices will be formed. In FIG. 10B, reference numeral 24 denotes the cluster beam implant step, reference numeral 26 denotes the first surface threshold voltage adjusting region that is formed within the high k gate dielectric 20, and reference numeral 51 denotes a modified layer 50 that is fused with the cluster material and partially fused with the material from high k gate dielectric 20 depending on the target thickness for surface region 26. The surface region 26 target thickness is from 0 nm (no layer 26 is formed) to about 2 nm. If surface region 26 is not formed, only layer 51 is formed at this step. The surface region 26 also includes elements that are present in the layer 50 due to localized melting and intermixing during the cluster implantation process. It is due to this fact that the constituents of layer 50 are selected to be compatible with the base high k gate dielectric layer 20. Layer 50 serves as an offset layer for the cluster implantation step allowing for using higher cluster energies and leading to deeper molten zones. Alternatively, the cluster implantation step can be used to only form layer 51 adjusting threshold voltage through the presence of layer 51. The energy of cluster implantation is selected to allow for intermixing within full thickness of layer 50 plus target thickness of surface region 26. A typical energy for such ionized cluster is selected from the range of 3 keV to 80 keV depending on specific thickness of layer 50 and target depth of surface region 26. The type of threshold voltage adjusting impurities that can be employed in this embodiment are the same as described above.

Figure 10C:
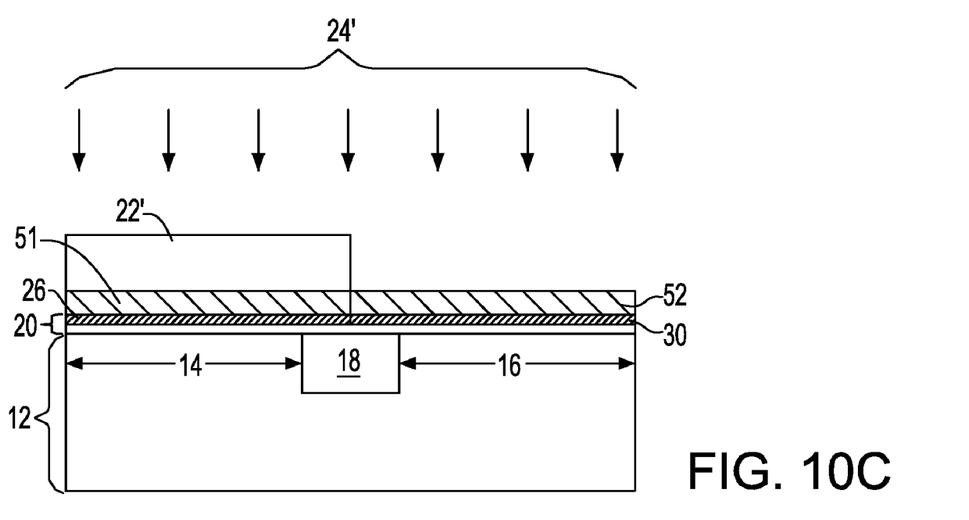

After the first cluster beam implant has been performed, the first patterned mask 22 is stripped and thereafter a second patterned mask 22' is formed over the first device region. A second cluster beam implant step 24' is then performed, as shown in FIG. 10C, forming the second surface threshold voltage adjusting region 30 within the high k gate dielectric 20 in the second device region 16. The type of threshold voltage adjusting impurity used in the second cluster beam implant is the other of the pFET threshold voltage adjusting impurity or the nFET threshold voltage adjusting impurity not used in the first cluster beam implant. Similarly to the first cluster implant process, surface region 30 also includes elements that are present in the layer 50 due to localized melting and intermixing during cluster implantation process. It is due to this fact that the constituents of layer 50 are selected to be compatible with the base high k gate dielectric layer 20 for both device regions 14 and 16 and proper operation of both devices formed in these regions. Surface region 30 target thickness is from 0 nm (no surface region 30 is formed) to about 2 nm. If surface region 30 is not formed, only layer 52 is formed at this step. Layer 52 is similar to layer 51.

Alternatively, the second threshold voltage adjusting impurity employed is a different threshold voltage adjusting impurity (different type, dose, or fusion depth) used for a different device of the same polarity. In this manner, two types of nFETs can be beneficially produced on the same substrate with two different threshold voltages. Likewise, two types of pFETs can be beneficially produced on the same substrate with two different threshold voltages.

For the particular embodiment illustrated in the drawings, the second surface threshold voltage adjusting region 30 is composed of an nFET threshold voltage adjusting impurity, while the first surface threshold voltage adjusting region 26 is composed of a pFET threshold voltage adjusting impurity.

Figure 10D:
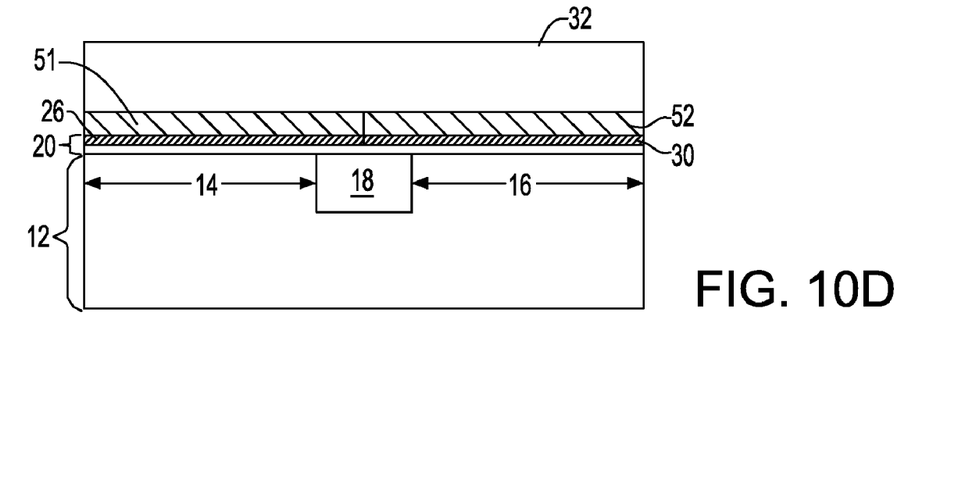

Following the formation of the structure shown in FIG. 10C, the second patterned mask 22' is stripped, a second gate conductor layer 32 is then formed atop the first gate conductor layers 51 and 52 (as shown in FIG. 10D) and then the material stack is patterned as described above. Following material stack patterning, further CMOS device fabrication is performed forming a structure such as shown in FIG. 9.

Figure 11:
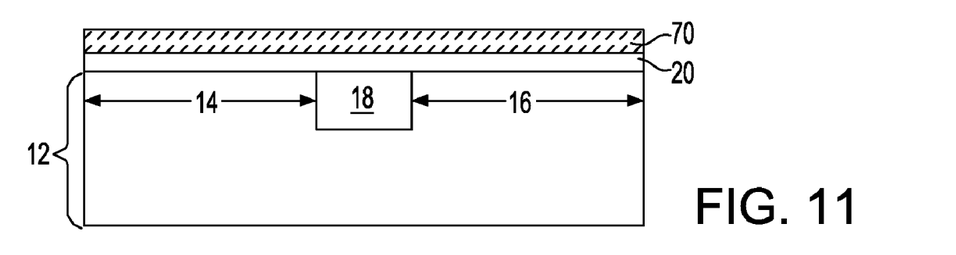
FIG. 11 is a pictorial representation (through a cross sectional view) illustrating the structure of FIG. 1 after forming a first threshold voltage adjusting material atop the high k gate dielectric in accordance with a second embodiment of the present invention.

Reference is now made to FIG. 11, which illustrates a structure after forming a first threshold voltage adjusting material 70 atop the high k gate dielectric 20 in accordance with a second embodiment of the present invention. The second embodiment utilizes the initial structure 10 shown in FIG. 1. The term "threshold voltage adjusting material" as used throughout the instant application denotes a material that moves the threshold voltage of a gate stack towards either the nFET or pFET band edge. The threshold voltage adjusting material 70 employed in the present invention may include an nFET threshold voltage adjusting material or a pFET threshold voltage adjusting material. The type of threshold voltage adjusting material employed in this step of the invention is dependent on which conductivity type device, e.g., nFET or pFET, is being fabricated.

One example of an nFET threshold voltage adjusting material that can be used is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ or LaN being more preferred.

The rare earth metal-containing material can be formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment, the rare earth metal-containing material can be formed by placing the structure including the high-k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1\times10^{-5}$ Torr to $8\times10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be used is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. It is noted that the present invention contemplates alkaline earth metal-containing compounds that include a mixture of alkaline earth metals and/or a mixture of anions, such as an oxychloride. Examples of alkaline earth metal-containing compounds that can be used include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in some embodiments of the present invention.

The alkaline earth metal-containing material can be formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

In addition to nFET threshold voltage adjusting materials, the first threshold voltage adjusting material 70 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The nFET threshold voltage adjusting materials can be formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), sputtering and plating.

Notwithstanding the type of material used as the first threshold voltage adjusting material 70, the first threshold voltage adjusting material 70 has a thickness from 0.1 nm to 5.0 nm, with a thickness from 0.3 nm to 2.0 nm being even more typical.

After forming the first threshold voltage adjusting material 70 atop the high k gate dielectric 20, a first patterned mask 22 is formed over one of the device regions. In the embodiment illustrated in FIG. 12, the first patterned mask 22 is formed over the first device region 14. The first patterned mask 22 is formed as described above and it is composed of materials as also described above.

Figure 12:
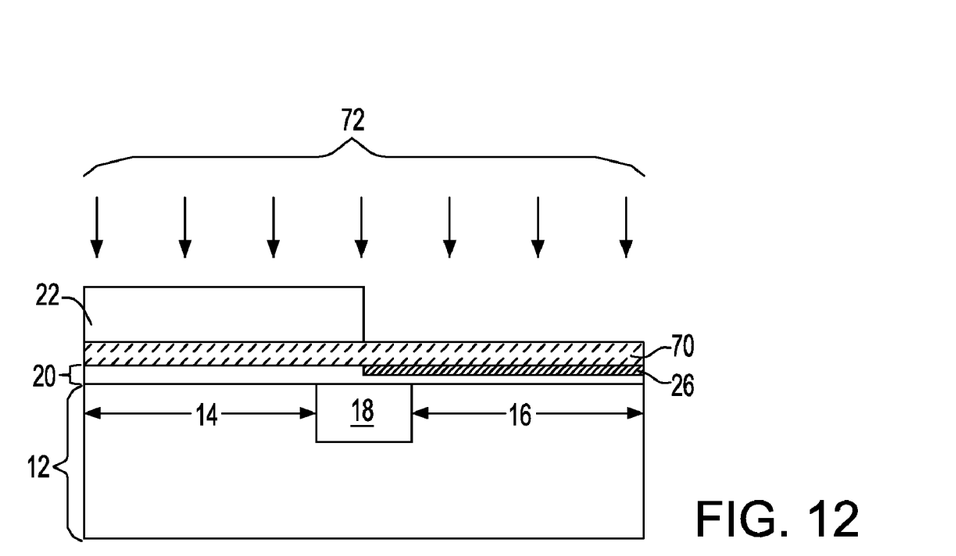
FIG. 12 is a pictorial representation (through a cross sectional view) illustrating the structure of FIG. 11 after forming a first patterned mask atop one of the device regions of the substrate and during a step of driving in a first threshold voltage adjusting impurity from the first threshold voltage adjusting material into an upper surface of the exposed high k gate dielectric in the device region of the substrate not including the first patterned mask.

After forming the first patterned mask 22 over one of the device regions, an inert ion cluster beam implant step, such as an Ar ion cluster beam implant, is employed to drive and intermix in the first threshold voltage adjusting impurity from the first threshold voltage adjusting material 70 into the high k gate dielectric 20 that is not protected by the first patterned mask 22. FIG. 12 also illustrates the structure during this step of the invention. In FIG. 12, reference numeral 72 denotes the inert ion cluster beam implant step and reference numeral 26 denotes the first surface threshold voltage adjusting region that is formed into the high k gate dielectric 20. In this embodiment of the present invention, the first surface threshold voltage adjusting region 26 of the high k gate dielectric 20 is also located within 3 nm or less from the upper surface of the high k gate dielectric 20.

The inert ion cluster beam implantation process is used to drive and intermix the first threshold voltage adjusting impurity from the first threshold voltage adjusting material 70 into layer 20. The energy of clusters is selected based on the thickness of layer 70 and target thickness of first surface threshold voltage adjusting region 26. If layer 70 is 2 nm thick and the target thickness of surface region 26 is 1 nm, the energy of a singly ionized cluster is from 1 keV to 5 keV. The cluster size is typically from 1000 atoms to 40,000 atoms with from 3000 to 20,000 being more typical. The cluster dose is from 1e15 clusters/cm$^2$ to about 1e18 clusters/cm$^2$.

Figure 13:
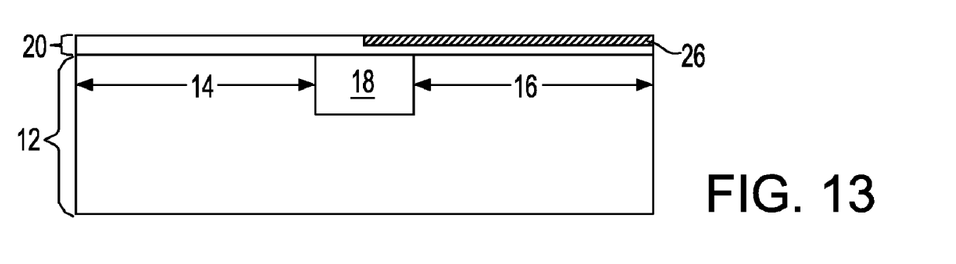
FIG. 13 is a pictorial representation (through a cross sectional view) illustrating the structure of FIG. 12 after removing the first patterned mask therefrom and stripping the first threshold voltage adjusting material from the structure.

FIG. 13 is a pictorial representation illustrating the structure of FIG. 12 after removing the first patterned mask 22 therefrom and removing the first threshold voltage adjusting material 70 (including material of layer 70 modified by cluster implant) from the structure utilizing a conventional etching process that is capable of selectively removing the first threshold voltage adjusting material 70 from the structure. An example of such a selective etching process is an acid based wet etching process that etches metal but is inert to surface region 26. Alternatively, the first threshold voltage adjusting material 70 is removed by a conventional reactive ion etching selective to surface region 26.

Figure 14:
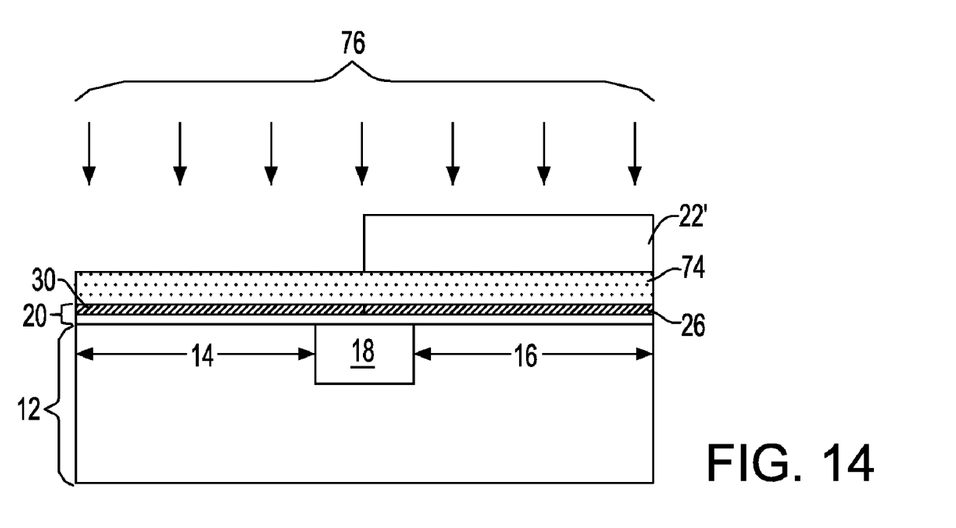
FIG. 14 is a pictorial representation (through a cross sectional view) illustrating the structure of FIG. 13 after forming a second threshold voltage adjusting material and a second patterned mask, and during driving in a second threshold voltage adjusting impurity from the second threshold voltage adjusting material into the gate dielectric not protected by the second patterned mask.

Referring to FIG. 14, a second threshold voltage adjusting material 74 and a second patterned mask 22' are then formed on the structure shown in FIG. 14. As shown, the second threshold voltage adjusting material 74 is formed atop the high k gate dielectric 20 in both device regions and the second patterned mask 22' is formed over the device region including high k gate dielectric 20 including the first surface threshold voltage adjusting region 26. The second threshold voltage adjusting material 74 is composed of the other of an nFET threshold adjusting material or a pFET threshold voltage adjusting material not used in the first threshold voltage adjusting material 70. That is, when the first threshold voltage material 70 includes a pFET threshold voltage adjusting material, then the second threshold voltage adjusting material includes an nFET threshold voltage adjusting material, and vice versa.

A second inert ion cluster beam implant 76 is then performed to drive in the second threshold voltage adjusting impurity from the second threshold voltage adjusting material 74 into the high k gate dielectric 20 not protected by the second patterned mask 22'. The second inert ion cluster beam implant is performed utilizing the conditions described in the first inert ion cluster beam implant step. In FIG. 14, reference numeral 30 denotes the second surface threshold voltage adjusting region that is formed into gate dielectric 20. The second surface threshold voltage adjusting region 30 is formed to have a depth within the range mentioned above for the first surface threshold voltage adjusting region 26 for this embodiment.

Alternatively, the second threshold voltage adjusting impurity employed is a different threshold voltage adjusting impurity (different type, dose, or fusion depth) used for a different device of the same polarity. In this manner, two types of nFETs can be beneficially produced on the same substrate with two different threshold voltages. Likewise, two types of pFETs can be beneficially produced on the same substrate with two different threshold voltages.

For the particular embodiment illustrated in the drawings, the second surface threshold voltage adjusting region 30 is composed of nFET threshold voltage adjusting impurities, while the first surface threshold voltage adjusting region 26 is composed of a pFET threshold voltage adjusting impurity.

Figure 15:
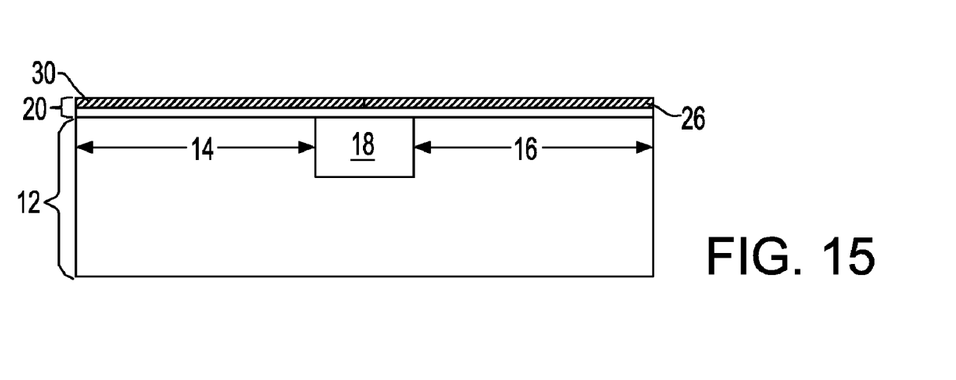
FIG. 15 is a pictorial representation (through a cross sectional view) illustrating the structure of FIG. 14 after removing both the second patterned mask and the second threshold voltage adjusting material.

After the implant, the second patterned mask 22' and the second threshold voltage adjusting material 74 are removed, as described, above, providing the structure shown in FIG. 15. The structure shown in FIG. 15 can then be processed as shown in FIGS. 8-9 of the first embodiment of the invention. The resultant structure of this embodiment would be similar to that shown in FIG. 9.

Notwithstanding which embodiment of the invention is employed, the present invention provides a method for forming a threshold voltage adjusted and tuned FET including a high k gate dielectric. Is noted that the formation of the threshold voltage adjusting impurity within the surface region of the high k gate dielectric utilizing a cluster beam implant step provides a simpler and easier means for tuning the threshold voltage of the FET.

While these embodiments were described in relationship to the well-known gate-first approach where the gate dielectric and electrodes are formed first and other elements of the transistor formed later as shown in FIGS. 7-9, the same inventive steps can be beneficially applied in the gate last approach, also well know in the art, where the elements of a transistor as shown in FIG. 9 are build first and then all or part of gate electrode material 32 is removed allowing for transistor threshold voltage adjustment in accordance with this invention. The transistor structure is completed by forming a new gate electrode and its patterning using chemical mechanical polishing. In this case, the inventive process allows for a greater flexibility of employing a low thermal budget sintering step that does not interfere with the temperature sensitive elements that are already present in the transistor structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
forming a high k gate dielectric atop a semiconductor substrate including a first device region and a second device region;
selectively forming a first surface threshold voltage adjusting region in one portion of the high k gate dielectric located within 3 nm or less from an upper surface of the high k gate dielectric in either the first device region or the second device region; and
selectively forming a second surface threshold voltage adjusting region in another portion of the high k gate dielectric located within 3 nm or less from the upper surface of the high k gate dielectric in the other of the first device region or the second device region not including the first surface threshold voltage adjusting region, wherein said selectively forming the first and second threshold voltage adjusting regions comprises:
forming a first threshold voltage adjusting material atop the high k gate dielectric in both device regions, forming a first patterned mask atop the first threshold voltage adjusting material in one of the device regions, performing an inert ion cluster beam implant process which drives a first threshold voltage adjusting impurity from said first threshold voltage adjusting material not protected by the first patterned mask into a portion of said high k gate dielectric, removing the first patterned mask and the first threshold voltage adjusting material, forming a second threshold voltage adjusting material atop the high k gate dielectric in both device regions, forming a second patterned mask atop the second threshold voltage adjusting material in the device region including the first threshold voltage adjusting impurity, performing another inert ion cluster beam process which drives a second threshold voltage adjusting impurity from said second threshold voltage adjusting material not protected by the second patterned mask into another portion of the high k gate dielectric, and removing the second patterned mask and the second threshold voltage adjusting material.

2. The method of claim 1 wherein said first surface threshold voltage adjusting region includes an nFET threshold voltage adjusting impurity or a pFET threshold voltage adjusting impurity, and said second surface threshold voltage adjusting region includes the other of said nFET threshold voltage adjusting impurity or said pFET threshold voltage adjusting impurity not included in the first surface threshold voltage adjusting region.

3. The method of claim 2 wherein said nFET threshold voltage adjusting impurity is a rare earth metal impurity selected from Group IIIB of the Periodic Table of Elements or an alkaline earth metal impurity selected Group IIA of the Periodic Table of Elements.

4. The method of claim 2 wherein said pFET threshold voltage adjusting impurity is selected from Al, Ge, Ti and Ta.

5. The method of claim 1 wherein first threshold voltage adjusting material includes an nFET threshold voltage adjusting material or a pFET threshold voltage adjusting material, and said second threshold voltage adjusting material includes the other of said nFET threshold voltage adjusting material or said pFET threshold voltage adjusting material not included in the first threshold voltage adjusting material.

6. The method of claim 5 wherein said nFET threshold voltage adjusting material is a rare earth metal compound comprising a rare earth metal selected from Group IIIB of the Periodic Table of Elements or an alkaline earth metal compound comprising an alkaline earth metal selected Group IIA of the Periodic Table of Elements.

7. The method of claim 1 wherein said pFET threshold voltage adjusting material comprises a compound comprising a metal selected from Al, Ge, Ti and Ta.

8. The method of claim 1 wherein said inert ion cluster beam implant process and said another inert ion cluster beam ion implant process each comprise clusters of Ar or Xe.

9. The method of claim 1 wherein said inert ion cluster beam implant process and said another inert ion cluster beam ion implant process are both performed utilizing an energy of a singular cluster of ions of from 1 keV to 5 keV.

10. The method of claim 1 wherein said inert ion cluster beam implant process and said another inert ion cluster beam ion implant process are both performed utilizing a cluster size from 1000 atoms to 40,000 atoms.

11. The method of claim 10 wherein said cluster size is from 3000 atoms to 20,000 atoms.

12. The method of claim 1 wherein said inert ion cluster beam implant process and said another inert ion cluster beam ion implant process are both performed utilizing a cluster dose from 1e15 clusters/cm$^2$ to 1e18 clusters/cm$^2$.

13. The method of claim 1 wherein said removing the first patterned mask and the first threshold voltage adjusting material comprises an acid based wet etching process.

14. The method of claim 1 wherein said first surface threshold voltage adjusting region and said second surface threshold voltage adjusting region are located at a same depth below the upper surface of the high k gate dielectric.

15. The method of claim 1 wherein said removing the second patterned mask and the second threshold voltage adjusting material comprises an acid based wet etching process.

16. The method of claim 1 wherein said first surface threshold voltage adjusting region and said second surface threshold voltage adjusting region each have an upper surface that is coplanar to each other.

17. The method of claim 1 wherein said forming a high k gate dielectric comprises selecting one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$, wherein each value of x is independently from 0.5 to 3 and each value of y is independently from 0 to 2.

18. The method of claim 1 further comprising forming at least one conductive material atop the first surface threshold voltage adjusting region and said second surface threshold voltage adjusting region, and forming a p-channel field effect transistor in one of the device regions and a n-channel field effect transistor in the other device region.

* * * * *